US009689627B2

United States Patent
Tsai (10) Patent No.: US 9,689,627 B2
(45) Date of Patent: Jun. 27, 2017

(54) WATER-COOLING DEVICE WITH WATERPROOF STATOR AND ROTOR PUMPING UNIT

(71) Applicant: Bor-Bin Tsai, Taipei (TW)

(72) Inventor: Bor-Bin Tsai, Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 565 days.

(21) Appl. No.: 13/759,055

(22) Filed: Feb. 5, 2013

(65) Prior Publication Data
US 2014/0216695 A1   Aug. 7, 2014

(51) Int. Cl.
| | | |
|---|---|---|
| F28D 15/00 | (2006.01) | |
| F28F 3/12 | (2006.01) | |
| H01L 23/473 | (2006.01) | |
| F04D 13/06 | (2006.01) | |
| F04D 29/44 | (2006.01) | |
| F04D 29/58 | (2006.01) | |

(52) U.S. Cl.
CPC ............ *F28F 3/12* (2013.01); *F04D 13/0626* (2013.01); *F04D 13/0673* (2013.01); *F04D 29/445* (2013.01); *F04D 29/5893* (2013.01); *H01L 23/473* (2013.01); *F28F 2250/08* (2013.01); *H01L 2924/0002* (2013.01)

(58) Field of Classification Search
CPC .. H02K 5/20; H02K 3/24; H02K 9/19; H02K 9/22; H01L 23/473; F28F 3/12; F04D 13/0606; F04D 13/0626; F04D 13/0673; F04D 29/5806; F28D 15/00
See application file for complete search history.

(56) References Cited

U.S. PATENT DOCUMENTS

| | | | | |
|---|---|---|---|---|
| 4,311,932 A | * | 1/1982 | Olson | 310/61 |
| 5,051,634 A | * | 9/1991 | Overton | 310/64 |
| 6,808,371 B2 | * | 10/2004 | Niwatsukino | F04D 5/002 |
| | | | | 361/699 |
| 7,016,195 B2 | * | 3/2006 | Ito | F04D 5/002 |
| | | | | 165/80.3 |

(Continued)

FOREIGN PATENT DOCUMENTS

| | | | | |
|---|---|---|---|---|
| CN | 101113736 A | 1/2008 | | |
| JP | WO 2011099196 A2 | * | 8/2011 | ......... F04D 13/0606 |
| TW | EP 1696129 A2 | * | 8/2006 | ........... F04D 13/027 |

*Primary Examiner* — Len Tran
*Assistant Examiner* — Gordon Jones
(74) *Attorney, Agent, or Firm* — C. G. Mersereau; Nikolai & Mersereau, P.A.

(57) ABSTRACT

A water-cooling module includes a main body. The main body has a receiving space and a water room partitioning board. The receiving space is partitioned by the water room partitioning board into a pump chamber and a heat exchange chamber. The pump chamber and the heat exchange chamber communicate with each other through at least one communication section. A pump unit is disposed in the pump chamber. A heat transfer unit is disposed in the heat exchange chamber. A cooling fluid is filled up in the main body to circulate within the pump chamber and the heat exchange chamber. The pump unit is entirely immersed in the cooling fluid so that the operation efficiency of the pump unit is enhanced and the main body is thinned. Moreover, the problem of overheating of the pump unit in operation is solved.

6 Claims, 9 Drawing Sheets

(56) References Cited

U.S. PATENT DOCUMENTS

| | | | | |
|---|---|---|---|---|
| 7,249,625 B2* | 7/2007 | Duan | ............... | G06F 1/20 |
| | | | | 165/104.28 |
| 7,251,137 B2* | 7/2007 | Iijima | ............... | F04D 13/0673 |
| | | | | 165/104.33 |
| 7,319,587 B2* | 1/2008 | Tomioka | ............... | F04D 29/588 |
| | | | | 165/80.4 |
| 7,729,118 B2* | 6/2010 | Lai et al. | ............... | 361/699 |
| 7,766,629 B2* | 8/2010 | Seko | ............... | F04D 5/002 |
| | | | | 361/699 |
| 2005/0178526 A1* | 8/2005 | Naganawa | ............... | F04D 9/007 |
| | | | | 165/80.2 |
| 2005/0243520 A1* | 11/2005 | Tomioka et al. | ............... | 361/702 |
| 2006/0171801 A1* | 8/2006 | Manabe | ............... | F04D 13/0673 |
| | | | | 415/176 |
| 2007/0243086 A1* | 10/2007 | Sakai | ............... | F04D 13/0606 |
| | | | | 417/423.1 |
| 2007/0253844 A1* | 11/2007 | Chen | ............... | F04D 13/0673 |
| | | | | 417/423.3 |
| 2008/0053641 A1* | 3/2008 | Lai | ............... | H01L 23/4006 |
| | | | | 165/120 |
| 2008/0069706 A1* | 3/2008 | Huang | ............... | F04D 29/586 |
| | | | | 417/351 |
| 2009/0114375 A1* | 5/2009 | Chiang | ............... | H01L 23/473 |
| | | | | 165/104.28 |
| 2009/0154101 A1* | 6/2009 | Korich | ............... | H02M 7/003 |
| | | | | 361/699 |
| 2009/0162225 A1* | 6/2009 | Lai | ............... | F04D 13/0673 |
| | | | | 417/423.3 |
| 2010/0322801 A1* | 12/2010 | Tang | ............... | F04D 13/08 |
| | | | | 417/423.14 |

* cited by examiner

WATER-COOLING DEVICE WITH WATERPROOF STATOR AND ROTOR PUMPING UNIT

BACKGROUND OF THE INVENTION

1. Field of the Invention

The present invention relates generally to a water-cooling module, and more particularly to a water-cooling module, which has higher heat dissipation performance and is free from the problem of overheating of the internal pump unit.

2. Description of the Related Art

A conventional water-cooling thermal module includes a heat sink made of copper or aluminum with good thermal conductivity. One side of the heat sink is directly attached to a heat generation component such as a central processor for absorbing the heat generated by the central processor. The other side of the heat sink transfers the heat to a cooling fluid in the water-cooling thermal module. The heat exchange efficiency of such structure is not good. This is because the heat exchange or heat dissipation area between the heat sink and the cooling fluid is too small. When the cooling fluid quickly flows through the radiating fins of the heat sink, the cooling fluid can hardly carry away the heat absorbed by the radiating fins. In order to eliminate this shortcoming, multiple column bodies or flow ways are disposed on one side of the heat sink to enlarge the heat exchange or heat dissipation area between the heat sink and the cooling fluid. However, the heat dissipation performance can be only slightly enhanced and the effect is still poor. As a result, the heat can be hardly effectively dissipated and the heat dissipation efficiency is poor.

Moreover, in operation of the pump unit of the conventional water-cooling module, the stator assembly will generate heat. In addition, the stator assembly must be isolated from the cooling fluid. Therefore, the stator assembly itself can be only air-cooled to dissipate the heat. Such cooling effect is poor. Accordingly, it often takes place that the stator assembly burns out due to overheating. The problem of overheating of the stator assembly will shorten the lifetime of the water-cooling module.

Also, in the conventional water-cooling module, in order to protect the stator assembly of the pump unit from damage due to contact with the cooling fluid, the stator assembly is positioned on outer side of the water-cooling module, while the rotor assembly for driving the cooling fluid to circulate within the water-cooling module is positioned inside the water-cooling module corresponding to the stator assembly. The magnetization between the stator assembly and the rotor assembly takes place through the housing of the water-cooling module so as to operate the rotor assembly. In consideration of sufficient structural strength, the housing of the water-cooling module must have a certain thickness. Therefore, the rotor assembly and the stator assembly are spaced from each other by a considerable distance due to the thickness of the housing. This will affect the operation efficiency of the pump unit. As a result, as a whole, the heat dissipation performance of the water-cooling module will be deteriorated.

SUMMARY OF THE INVENTION

It is therefore a primary object of the present invention to provide a water-cooling module, which has higher heat dissipation performance.

It is a further object of the present invention to provide the above water-cooling module, which has longer lifetime.

To achieve the above and other objects, the water-cooling module of the present invention includes a main body. The main body has a receiving space and a water room partitioning board. The receiving space is partitioned by the water room partitioning board into a pump chamber and a heat exchange chamber. The pump chamber and the heat exchange chamber communicate with each other through at least one communication section. A pump unit is disposed in the pump chamber. A heat transfer unit is disposed in the heat exchange chamber. A cooling fluid is filled up in the main body to circulate within the pump chamber and the heat exchange chamber.

Alternatively, the water-cooling module of the present invention includes a main body, an outlet and a heat transfer unit.

The main body has a receiving space. The receiving space has a closed side and an open side and a water room partitioning board. The receiving space is partitioned by the water room partitioning board into a pump chamber and a heat exchange chamber. A pump unit is connected to the closed side. The water room partitioning board has a communication hole and a water passage. The water passage is connected to an inlet on one side of the main body. A cooling fluid is filled in the receiving space.

The outlet is disposed on one side of the main body, which side is adjacent to the heat exchange chamber. The outlet communicates with the heat exchange chamber.

The heat transfer unit has a heat absorption face and a heat dissipation face. The heat dissipation face correspondingly blocks the open side.

In the above water-cooling module, the rotor assembly and the stator assembly of the pump unit are both arranged in the same chamber so that the operation efficiency of the pump unit is greatly increased and the heat dissipation performance of the water-cooling module is enhanced. Moreover, the rotor assembly and the stator assembly of the pump unit are together received in the pump chamber so that the stator assembly is also cooled by the cooling fluid. Therefore, the stator assembly will not overheat. In this case, the lifetime of the water-cooling module is prolonged.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
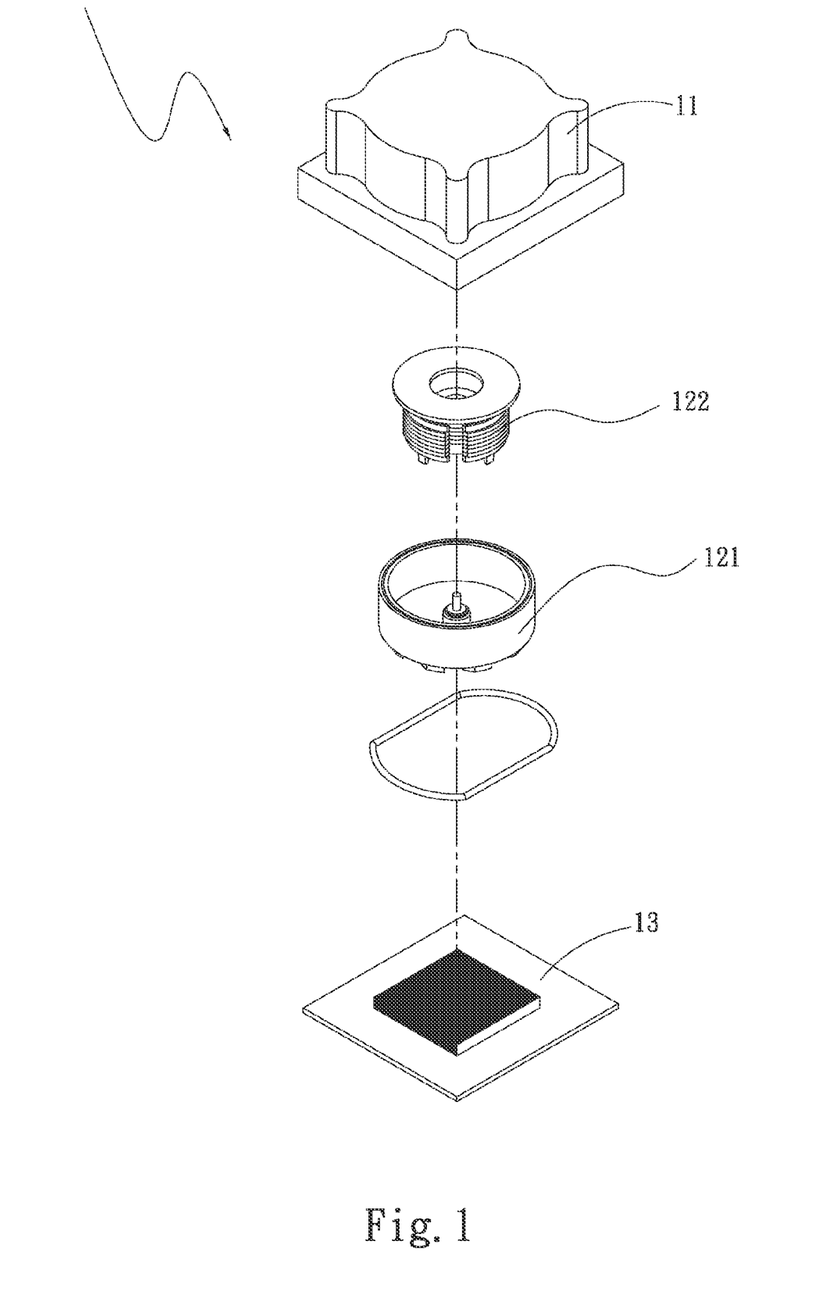
FIG. 1 is a perspective exploded view of a first embodiment of the water-cooling module of the present invention.
Figure 2:
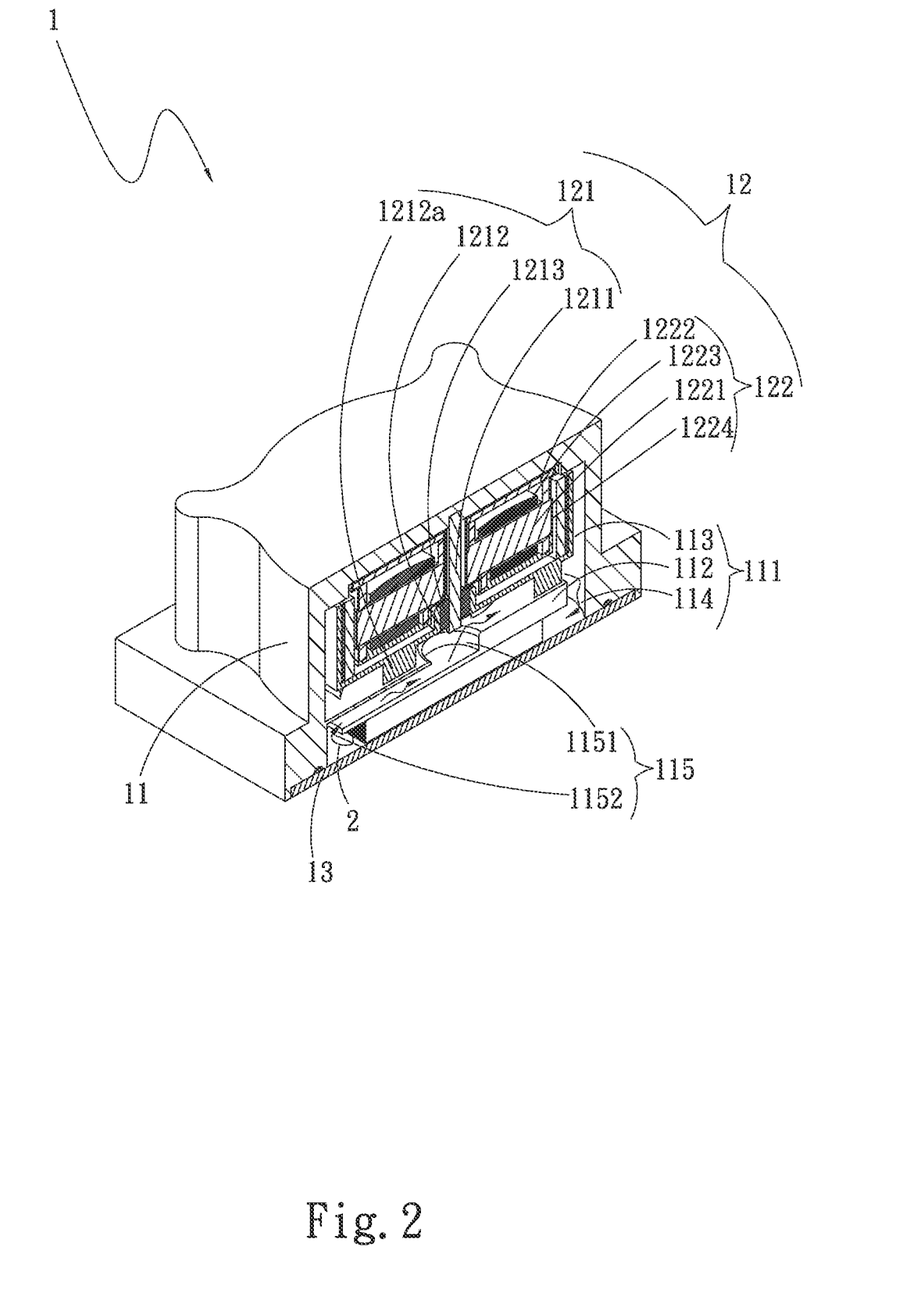
FIG. 2 is a perspective sectional view of the first embodiment of the water-cooling module of the present invention.

Please refer to FIGS. 1 and 2. FIG. 1 is a perspective exploded view of a first embodiment of the water-cooling module of the present invention. FIG. 2 is a perspective sectional view of the first embodiment of the water-cooling module of the present invention. According to the first embodiment, the water-cooling module 1 of the present invention includes a main body 11.

The main body 11 has a receiving space 111 and a water room partitioning board 112. The receiving space 111 is partitioned by the water room partitioning board 112 into a pump chamber 113 and a heat exchange chamber 114. The pump chamber 113 and the heat exchange chamber 114 communicate with each other through at least one communication section 115. A pump unit 12 is disposed in the pump chamber 113 and a heat transfer unit 13 is disposed in the heat exchange chamber 114. A cooling fluid 2 is filled up in the main body 11 to circulate within the pump chamber 113 and the heat exchange chamber 114.

The communication section 115 has a first communication hole 1151 and a second communication hole 1152. The first communication hole 1151 is aligned with the pump unit 12, while the second communication hole 1152 is eccentric to the pump unit 12.

The pump unit 12 has a rotor assembly 121 and a stator assembly 122. The rotor assembly 121 and the stator assembly 122 are together correspondingly disposed in the pump chamber 113. The rotor assembly 121 has a shaft 1211, a fan impeller 1212 and at least one bearing 1213. The bearing 1213 is connected with the fan impeller 1212. One end of the shaft 1211 is rotatably connected with the bearing 1213, while the other end of the shaft 1211 is assembled with the main body 11. The fan impeller 1212 has multiple blades 1212a. The stator assembly 122 has multiple silicon steel sheets 1221 and a substrate 1222. The silicon steel sheets 1221 are stacked and multiple windings 1223 are wound around the silicon steel sheets 1221. The silicon steel sheets 1221 and the windings 1223 and the substrate 1222 are enclosed in a waterproof structure layer 1224.

Figure 3:
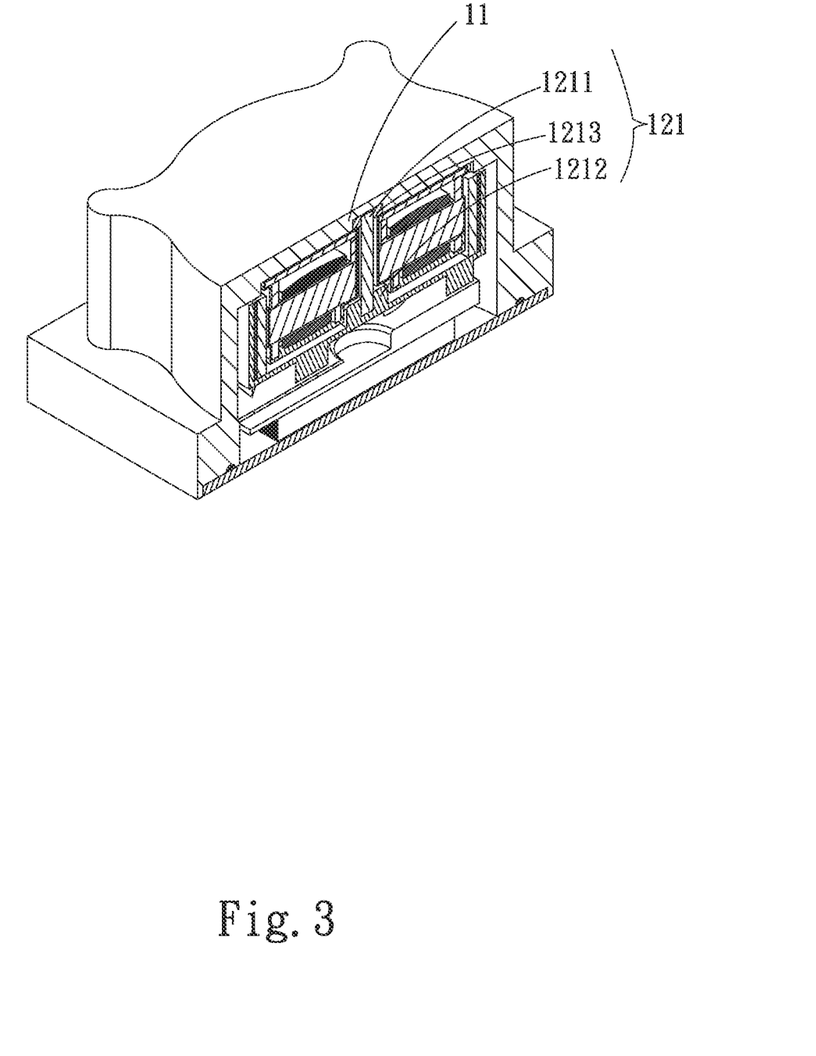
FIG. 3 is a perspective sectional view of a second embodiment of the water-cooling module of the present invention.

Please refer to FIG. 3, which is a perspective sectional view of a second embodiment of the water-cooling module of the present invention. The second embodiment is partially identical to the first embodiment in structure and thus will not be repeatedly described hereinafter. The second embodiment is different from the first embodiment in that the bearing 1213 of the rotor assembly 121 is assembled with the main body 11. One end of the shaft 1211 is plug-in connected with the fan impeller 1212, while the other end of the shaft 1211 is rotatably connected with the bearing 1213.

Figure 4:
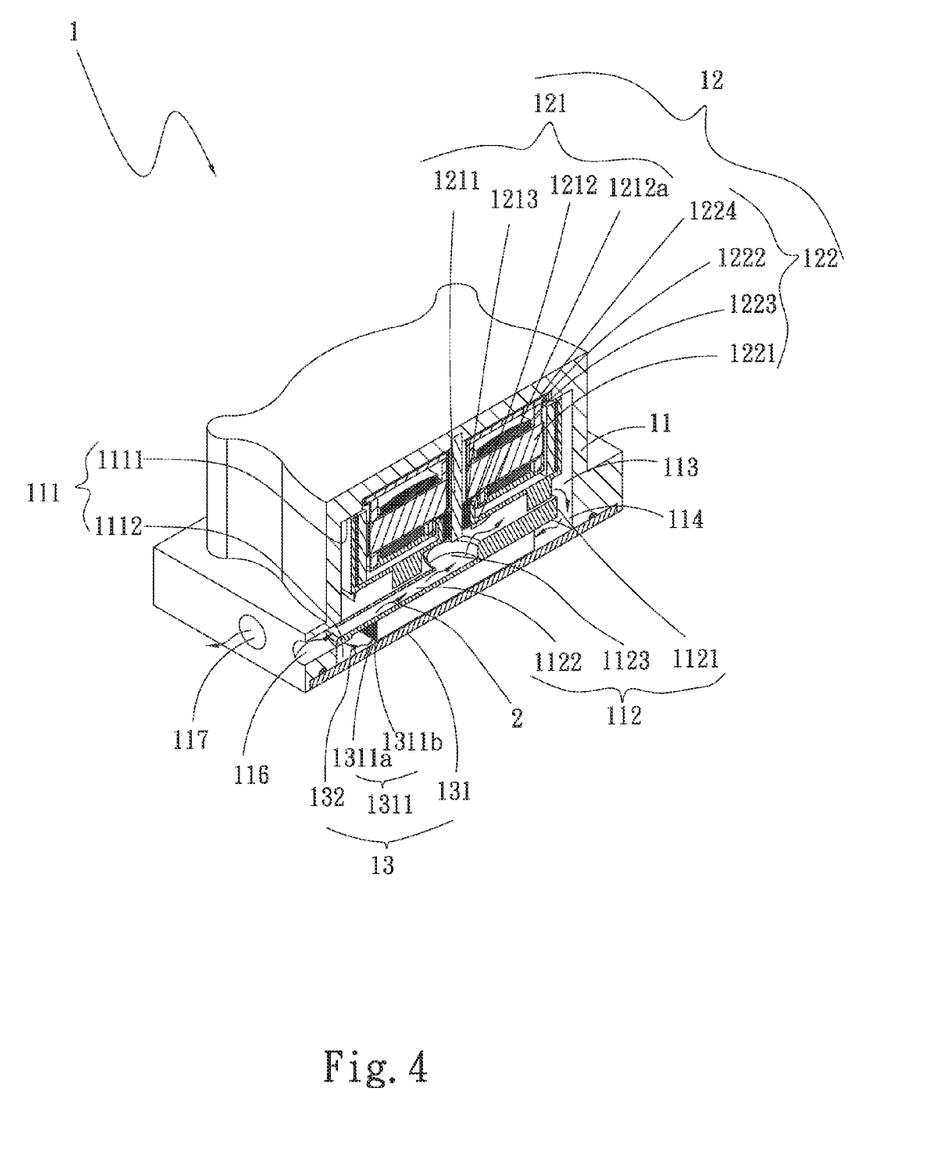
FIG. 4 is a perspective sectional view of a third embodiment of the water-cooling module of the present invention.

Please refer to FIG. 4, which is a perspective sectional view of a third embodiment of the water-cooling module of the present invention. According to the third embodiment, the water-cooling module 1 of the present invention includes a main body 11 and a heat transfer unit 13.

The main body 11 has a receiving space 111. The receiving space 111 has a closed side 1111 and an open side 1112 and a water room partitioning board 112. The receiving space 111 is partitioned by the water room partitioning board 112 into a pump chamber 113 and a heat exchange chamber 114. A pump unit 12 is connected to the closed side 1111. The water room partitioning board 112 has a communication hole 1121, a water passage 1122 and a water inlet 1123. One end of the water passage 1122 is connected to an inlet 116 on one side of the main body 11. The other end of the water passage 1122 communicates with the water inlet 1123. A cooling fluid 2 is filled in the receiving space 111. An outlet 117 is disposed on one side of the main body 11, which side is adjacent to the heat exchange chamber 114. The outlet 117 communicates with the heat exchange chamber 114.

The heat transfer unit 13 has a heat absorption face 131 and a heat dissipation face 132. The heat dissipation face 132 correspondingly blocks the open side 1112.

The pump unit 12 is composed of a rotor assembly 121 and a stator assembly 122. The rotor assembly 121 and the stator assembly 122 are correspondingly together disposed in the pump chamber 113. The rotor assembly 121 has a shaft 1211, a fan impeller 1212 and at least one bearing 1213. The bearing 1213 is assembled with the fan impeller 1212. One end of the shaft 1211 is rotatably connected with the bearing 1213, while the other end of the shaft 1211 is connected with the main body 11. The fan impeller 1212 has multiple blades 1212a. The stator assembly 122 has multiple silicon steel sheets 1221 and a substrate 1222. The silicon steel sheets 1221 are stacked and multiple windings 1223 are wound around the silicon steel sheets 1221. The silicon steel sheets 1221 and the windings 1223 and the substrate 1222 are enclosed in a waterproof structure layer 1224.

The communication hole 1121 of the water room partitioning board 112 is eccentric to the rotor assembly 121.

Figure 5:
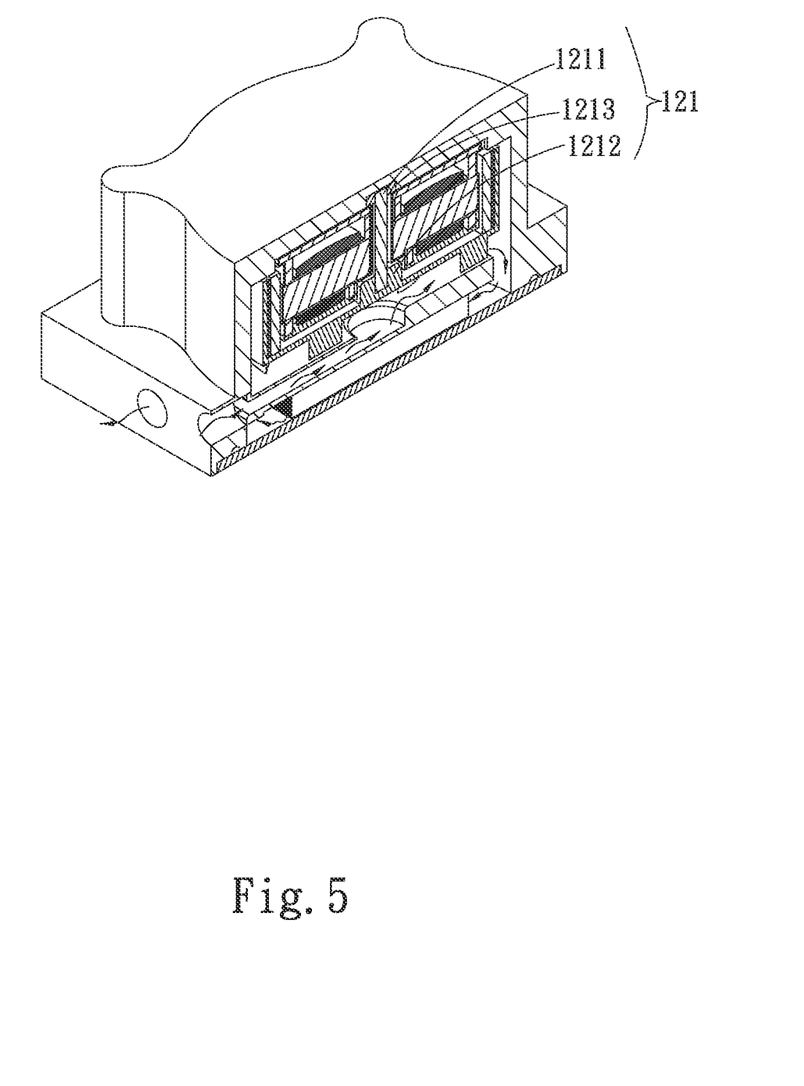
FIG. 5 is a perspective sectional view of a fourth embodiment of the water-cooling module of the present invention.

Please refer to FIG. 5, which is a perspective sectional view of a fourth embodiment of the water-cooling module of the present invention. The fourth embodiment is partially identical to the third embodiment in structure and thus will not be repeatedly described hereinafter. The fourth embodiment is different from the third embodiment in that the bearing 1213 of the rotor assembly 121 is assembled with the main body 11. One end of the shaft 1211 is plug-in connected with the fan impeller 1212, while the other end of the shaft 1211 is rotatably connected with the bearing 1213.

Figure 6:
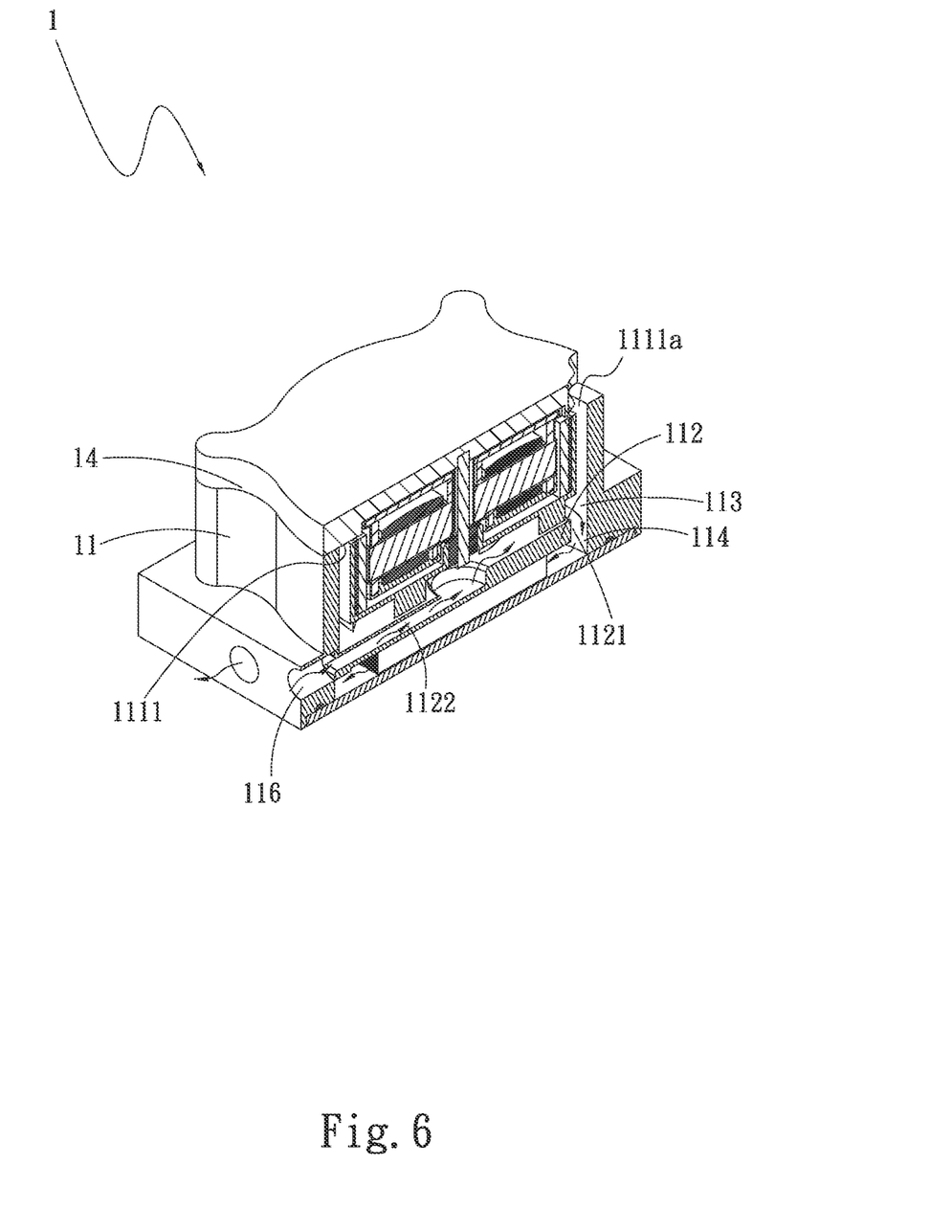
FIG. 6 is a perspective sectional view of a fifth embodiment of the water-cooling module of the present invention.

Please refer to FIG. 6, which is a perspective sectional view of a fifth embodiment of the water-cooling module of the present invention. The fifth embodiment is partially identical to the third embodiment in structure and thus will not be repeatedly described hereinafter. The fifth embodiment is different from the third embodiment in that the closed side 1111 of the main body 11 further has an opening 1111a. An upper cover 14 is mated with the opening 1111a. The pump unit 12 is connected to the main body 11. The water room partitioning board 112 is integrally formed with the main body 11. The water passage 1122 extends in the water room partitioning board 112 in a radial direction of the main body 11 to connect with the inlet 116. The communication hole 1121 passes through the water room partitioning board 112 in an axial direction of the main body 11 in communication with the pump chamber 113 and the heat exchange chamber 114.

Figure 7:
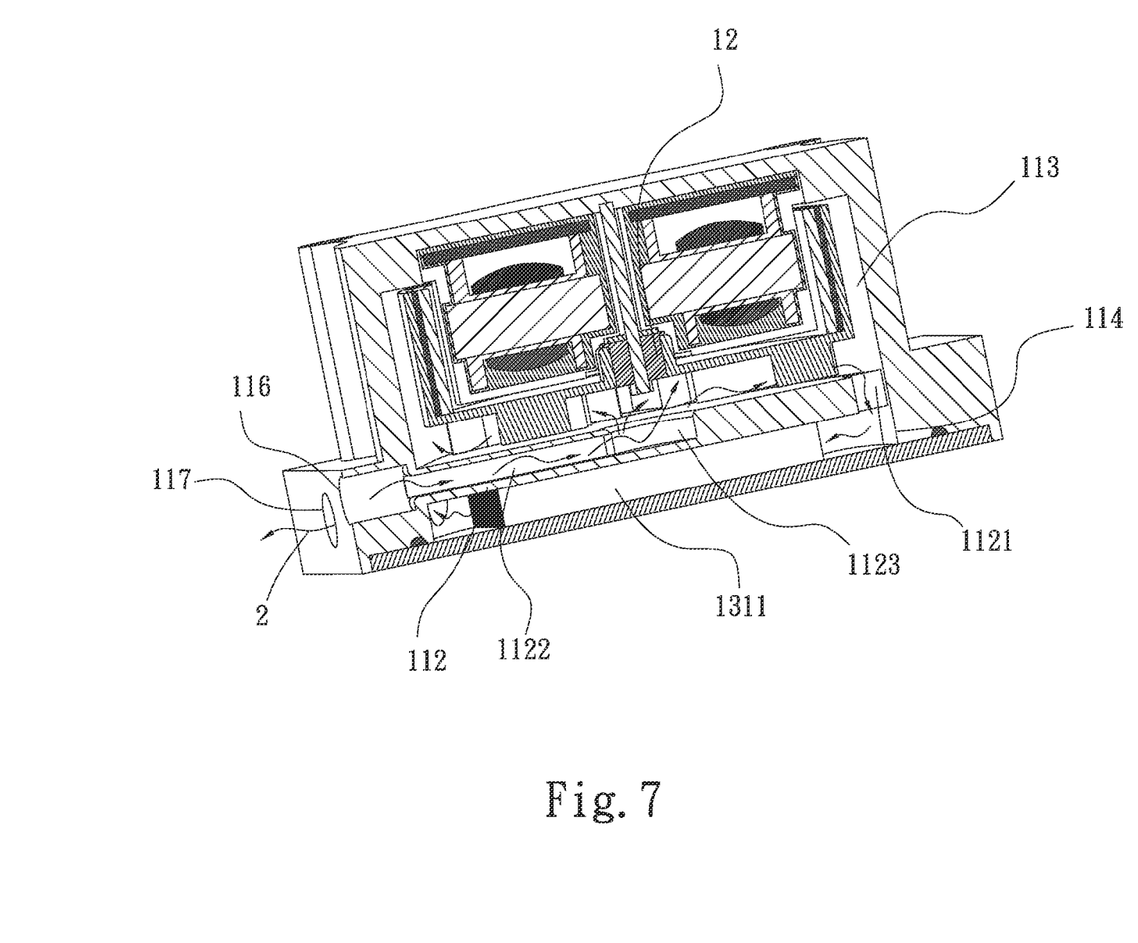
FIG. 7 is a view showing the operation of the water-cooling module of the present invention.

Please refer to FIG. 7 as well as FIGS. 4 to 6. In the third to fifth embodiments, the cooling fluid 2 flows from the inlet 116 through the water passage 1122 of the water room partitioning board 112 and the water inlet 1123 into the pump chamber 113. The blades 1212a of the rotor assembly 121 of the pump unit 12 drive the cooling fluid 2 to the communication hole 1121 to flow into the heat exchange chamber 114. Then heat exchange takes place between the cooling fluid 2 and the heat dissipation section 1311 disposed in the heat exchange chamber 114. Finally, the cooling fluid 2 is exhausted from the main body 11 through the outlet 117, which is disposed on one side of the main body 11 in communication with the heat exchange chamber 114.

Figure 8:
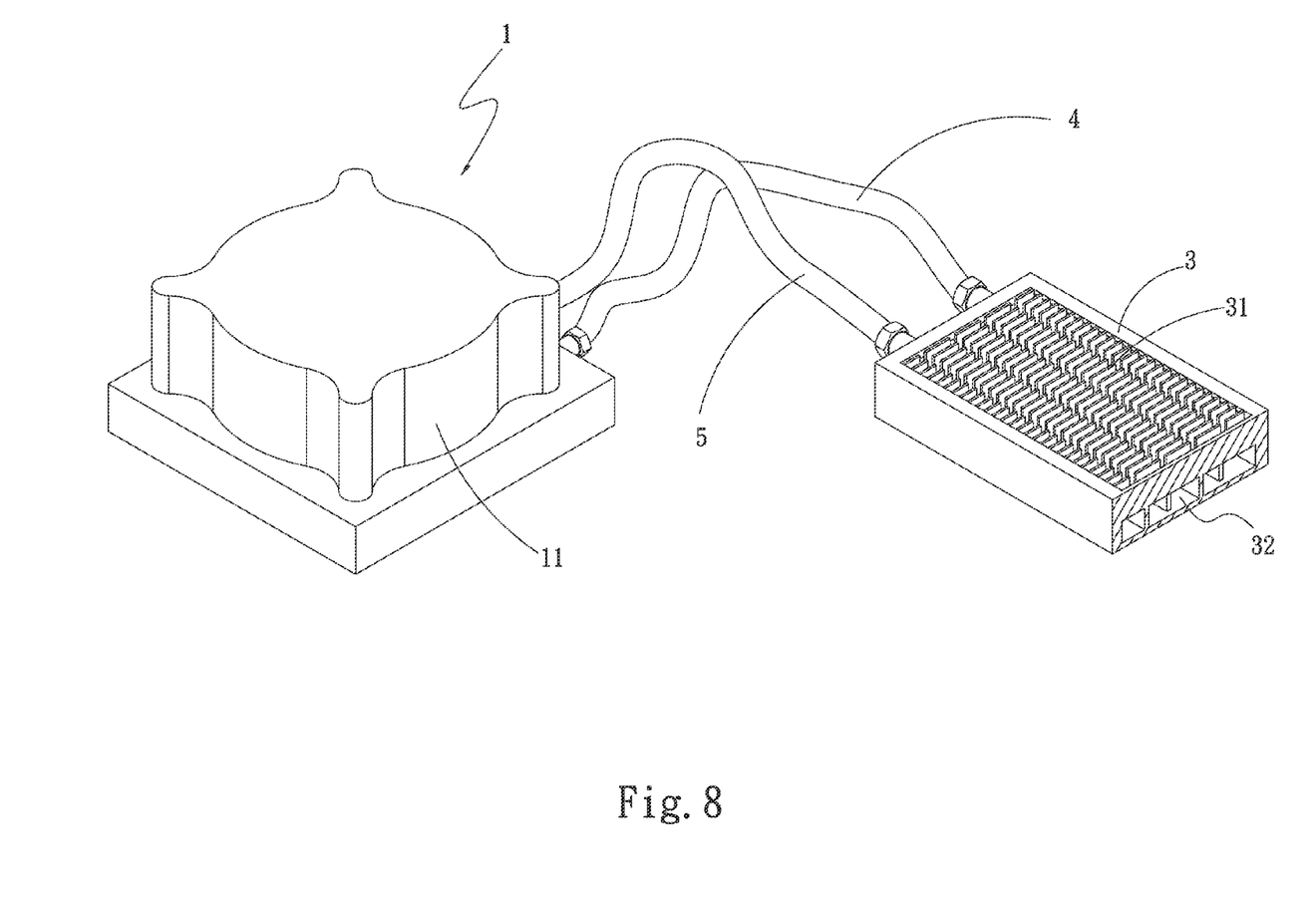
FIG. 8 is a perspective assembled view of a sixth embodiment of the water-cooling module of the present invention.

Please refer to FIG. 8, which is a perspective assembled view of a sixth embodiment of the water-cooling module of the present invention. The sixth embodiment is partially identical to the third embodiment in structure and thus will not be repeatedly described hereinafter. The sixth embodiment is different from the third embodiment in that the water-cooling module 1 further includes a heat dissipation unit 3, a first tube body 4 and a second tube body 5. The heat dissipation unit 3 communicates with the outlet 117 and inlet 116 of the main body 11 via the first and second tube bodies 4, 5 (with reference to FIG. 4).

The heat dissipation unit 3 is a cold row having multiple radiating fins 31 on outer side. The heat dissipation unit 3 has an internal liquid flow ways 32 in which a cooling fluid 2 is filled (with reference to FIG. 2). After exhausted from the main body 11, the cooling fluid 2 further flows to the heat dissipation unit 3 to dissipate the heat so as to enhance heat dissipation performance.

In the first to sixth embodiments, the heat transfer unit 13 is made of a material selected from a group consisting of copper, aluminum and good thermal conductor. The heat transfer unit 13 further has a heat dissipation section 1311 protruding from the heat dissipation face 131. The heat dissipation section 1311 has multiple radiating fins 1311a defining therebetween at least one flow way 1311b.

In the water-cooling module 1 of the present invention, the rotor assembly 121 and stator assembly 122 of the pump unit 12 for driving the internal cooling fluid 2 are together arranged in the pump chamber 113 of the water-cooling module 1. That is, the pump unit 12 is entirely immersed in the cooling fluid 2. In addition, the stator assembly 122 of the pump unit 12 is enclosed in a waterproof structure layer 1224 for protecting the silicon steel sheets 1221, the substrate 1222 and the windings 1223 of the stator assembly 122. The waterproof structure layer 1224 is quite thin so that the distance between the stator assembly 122 and the rotor assembly 121 is shortened. In this case, the magnetic loss caused in magnetization between the rotor assembly 121 and the stator assembly 122 is reduced so as to enhance the rotational efficiency of the pump unit 12.

Moreover, the stator assembly 122 is also immersed in the cooling fluid 2 and cooled by the cooling fluid 2 so that the problem of overheating of the stator assembly of the pump unit that exists in the conventional stator assembly is solved. In this case, the pump unit is prevented from burning out.

Figure 9:
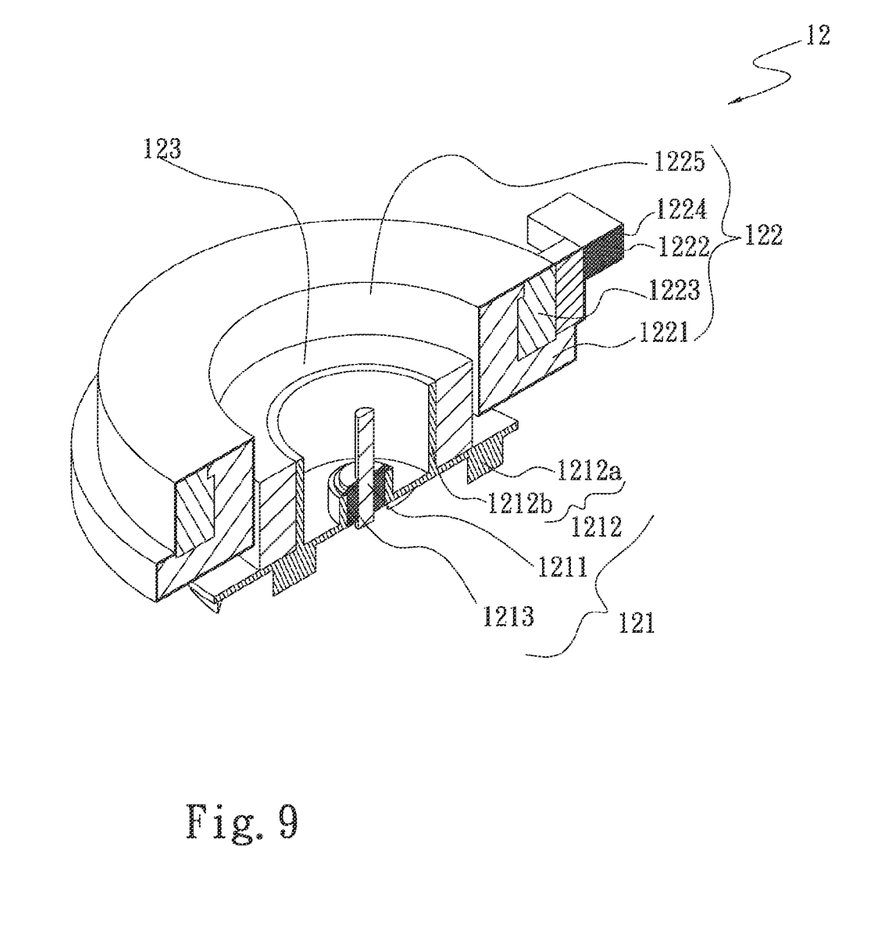
FIG. 9 is a perspective sectional view of the pump unit of still another embodiment of the water-cooling module of the present invention.

Please now refer to FIG. 9, which is a perspective sectional view of the pump unit of still another embodiment of the water-cooling module of the present invention. Also referring to FIGS. 1 to 8, in this embodiment, the pump unit 12 includes a rotor assembly 121 and a stator assembly 122 arranged around the rotor assembly 121. The pump unit 12 of this embodiment is also applicable to the above embodiments of the water-cooling module. The rotor assembly 121 and the stator assembly 122 are correspondingly disposed in the pump chamber 113. The rotor assembly 121 has a shaft 1211, a fan impeller 1212 and at least one bearing 1213. The bearing 1213 is assembled with the fan impeller 1212. One end of the shaft 1211 is rotatably connected with the bearing 1213, while the other end of the shaft 1211 is connected with the main body 11 (with reference to FIGS. 1 to 7). The fan impeller 1212 has multiple blades 1212a. The stator assembly 122 has multiple silicon steel sheets 1221 and a substrate 1222. The silicon steel sheets 1221 are stacked and multiple windings 1223 are wound around the silicon steel sheets 1221. The silicon steel sheets 1221 and the windings 1223 and the substrate 1222 are enclosed in a waterproof structure layer 1224. The stator assembly 122 has a central opening 1225. The fan impeller 1322 has a fan impeller main body 1212b. The fan impeller main body 1212b is correspondingly positioned in the opening 1225 without contacting therewith. A magnetic member 123 is further disposed between the outer circumference of the fan impeller main body 1212b and the wall of the opening 1225.

The present invention has been described with the above embodiments thereof and it is understood that many changes and modifications in the above embodiments can be carried out without departing from the scope and the spirit of the invention that is intended to be limited only by the appended claims.

What is claimed is:

1. A water-cooling module comprising a main body, the main body having a receiving space and a water room partitioning hoard, the receiving space being partitioned by the water room partitioning board into a pump chamber and a heat exchange chamber, the pump chamber and the heat exchange chamber communicating with each other through at least one communication section, a submersible pump unit being disposed in the pump chamber, a heat transfer unit being disposed in the heat exchange chamber, a cooling fluid being filled up in the main body to circulate within the pump chamber and the heat exchange chamber such that the bottom and sides of the pump chamber or the heat exchange chamber are within the cooling fluid;

wherein the submersible pump unit is entirely immersed in the cooling fluid, and the submersible pump unit has a rotor assembly and a stator assembly being received together in the pump chamber so that the stator assembly is cooled by the cooling fluid, the stator assembly being enclosed in a waterproof layer, the stator assembly and waterproof layer being immersed in the cooling fluid with the rotor assembly;

wherein the stator assembly has multiple silicon steel sheets, multiple windings and a circuit board, the silicon steel sheets and the windings and the circuit board being enclosed in the waterproof layer and cooled by the cooling fluid.

2. The water-cooling module as claimed in claim 1, wherein the communication section has a first communication hole and a second communication hole, the first communication hole being aligned with the submersible pump unit, while the second communication hole being eccentric to the pump unit.

3. The water-cooling module as claimed in claim 1, wherein the rotor assembly has a shaft, a fan impeller and at least one hearing, the bearing being assembled with the main body, one end of the shaft being rotatably connected with the bearing, while the other end of the shaft being connected with the fan impeller, the fan impeller having multiple blades, the silicon steel sheets being stacked and the windings being wound around the silicon steel sheets.

4. The water-cooling module as claimed in claim 1, wherein the pump unit has a rotor assembly and a stator assembly, the rotor assembly and the stator assembly being correspondingly together disposed in the pump chamber, the rotor assembly having a shaft, a fan impeller and at least one hearing, the bearing being assembled with the fan impeller, one end of a shaft being plug-in connected with the main body, while the other end of the shaft being rotatably connected with the hearing, the fan impeller having multiple blades, the stator assembly having multiple silicon steel sheets and a substrate, the silicon steel sheets being stacked and multiple windings being wound around the silicon steel sheets, the silicon steel sheets and the windings and the substrate being enclosed in a waterproof structure layer.

5. The water-cooling module as claimed in claim 1, wherein the heat transfer unit is made of a material selected from a group consisting of copper, aluminum and good thermal conductor, the heat transfer unit having a heat dissipation section protruding from a heat dissipation face of the heat transfer unit, the heat dissipation section having multiple radiating fins defining therebetween at least one flow way.

6. The water-cooling module as claimed in claim 1, wherein the pump unit includes a rotor assembly and a stator assembly arranged around the rotor assembly, the rotor assembly and the stator assembly being correspondingly disposed in the pump chamber, the rotor assembly having a shaft, a fan impeller and at least one bearing, the bearing being assembled with the fan impeller, one end of the shaft being rotatably connected with the bearing, while the other end of the shaft being connected with the main body, the fan impeller having multiple blades, the stator assembly having multiple silicon steel sheets and a substrate, the silicon steel sheets being stacked and multiple windings being wound around the silicon steel sheets, the silicon steel sheets and the windings and the substrate being enclosed in a waterproof structure layer, the stator assembly having a central opening, the fan impeller having a fan impeller main body, the fan impeller main body being correspondingly positioned in the opening without contacting therewith, a magnetic member being further disposed between an outer circumference of the fan impeller main body and a wall of the opening.

\* \* \* \* \*